United States Patent [19]
Fischer

[11] Patent Number: 5,811,976
[45] Date of Patent: Sep. 22, 1998

[54] METHOD AND APPARATUS TO DETERMINE THE LOCATION AND RESISTANCE OF AN ELECTRICAL LEAK WITHIN A BATTERY WITHOUT MEASURING INDIVIDUAL BATTERY CELLS

[75] Inventor: George A. Fischer, Grove City, Pa.

[73] Assignee: Joy MM Delaware, Inc., Wilmington, Del.

[21] Appl. No.: 778,896

[22] Filed: Jan. 3, 1997

[51] Int. Cl.⁶ .......................... G01N 27/416; G08B 21/00
[52] U.S. Cl. .......................... 324/434; 324/426; 324/433; 340/636; 340/650; 320/48; 364/482
[58] Field of Search ..................... 324/426, 427, 324/430, 433, 434, 435, 691, 713, 718, 522; 340/636, 650, 651; 320/48; 364/481, 482

[56] References Cited

U.S. PATENT DOCUMENTS

| | | | |
|---|---|---|---|
| 3,696,367 | 10/1972 | Inamdar | 340/651 |
| 3,754,221 | 8/1973 | Stelter | 340/651 |
| 3,786,343 | 1/1974 | Ehlers | 324/434 |
| 3,786,466 | 1/1974 | Naito et al. | 340/651 |
| 3,975,663 | 8/1976 | Moorey | 340/650 |
| 4,451,791 | 5/1984 | Ostroff et al. | 324/434 |
| 5,302,902 | 4/1994 | Groehl | 324/434 |
| 5,382,946 | 1/1995 | Gale | 340/650 |
| 5,686,839 | 11/1997 | Takagi | 324/522 |
| 5,712,568 | 1/1998 | Flohr et al. | 324/434 |

OTHER PUBLICATIONS

Lloyd A. Morley, *Mine Power Systems*, (Information Circular: 9258) pp. 375–381 (undated).

*Primary Examiner*—Diep N. Do
*Attorney, Agent, or Firm*—Kirkpatrick & Lockhart LLP

[57] ABSTRACT

An apparatus and method for determining a location and resistance of an electrical leak in a battery having a first and second terminals. The apparatus includes a resistor, a switch assembly for selectively connecting the resistor to the first terminal of the battery and for selectively connecting the resistor to the second terminal of the battery, and a controller. When the apparatus determine the location of the leak, the controller is responsive to a first signal indicative of a voltage across the resistor, responsive to a second signal indicative of a feature of the battery, and calculates a quotient formed from first and second values and indicative of the location of the leak, the first value including a product of the first signal when the resistor is connected to the first terminal of the battery and the second signal, and the second value including a sum of the first signal when the resistor is connected to the first terminal of the battery and the first signal when the resistor is connected to the second terminal of the battery.

27 Claims, 5 Drawing Sheets

METHOD AND APPARATUS TO DETERMINE THE LOCATION AND RESISTANCE OF AN ELECTRICAL LEAK WITHIN A BATTERY WITHOUT MEASURING INDIVIDUAL BATTERY CELLS

BACKGROUND OF THE INVENTION

1. Field of the Invention

The present invention is directed to a method and apparatus for determining the location and resistance of an electrical leak in a battery without measuring the individual cells that form the battery.

2. Description of the Background

In many industries, such as underground mining, batteries are the primary source of power and are used to operate vehicles and equipment. It is well known in the prior art that batteries occasionally develop leaks, also known as ground faults, either from defects in the cells that form the battery or from external conditions providing an electrical path from the battery to ground. Battery leaks can not only result in a dead battery, but can cause fires, explosions, and other life threatening situations, particularly in industries such as underground mining. As a result, many devices have been proposed to identify battery leaks before they become hazardous.

It is well known in the prior art to determine the resistance of an electrical leak from a battery, or other portion of a circuit, to ground. For example, U.S. Pat. No. 3,754,221, issued to Stelter (the "Stelter patent"), discloses a system for detecting ground faults in an electrical system associated with a battery. As shown in FIG. 8 of the Stelter patent, a switch is used to alternately connect a resistor to the positive and negative terminals of a battery. A sensing circuit detects the voltage across the resistor and sounds an alarm when the resistance of the leak is below a predetermined value. Another example is U.S. Pat. No. 3,786,466, issued to Naito et al. (the "Naito patent"), which discloses a system for detecting a leak from a battery to ground using two circuits, one connected to the positive terminal and one connected to the negative terminal. Each circuit has a switch, a resistor, and a voltage detection circuit. The switches are alternately opened and closed forming two alternate paths between a leak and the voltage detectors.

Once a leak is detected, the leaking cell within the battery must be repaired or replaced. However, there is not yet a good system for identifying which cell within a battery is leaking. Many solutions have been proposed, but most solutions require measuring or monitoring each of the cells individually. See, for example, U.S. Pat. Nos. 5,302,902, 4,451,791, and 3,786,343 issued to Groehl, Ostroff et al., and Ehlers, respectively. Many batteries contain well over one hundred cells, and the cost required to provide wires and monitoring hardware for each cell can be prohibitive. Furthermore, the maintenance requirements of such a complex system can be costly and time consuming, making them unsuitable for some applications.

A circuit to disable a system when leakage to ground becomes excessive is described in Information Circular 9258, entitled *Mine Power Systems* by Lloyd A. Morley, published by the United States Department of the Interior, Bureau of Mines. The system alternately shorts the terminals of the battery to ground and, when current exceeds a predetermined value, a relay is energized to disable the system. As stated in the reference, however, the circuit is not dependable because the amount of current sensed by the system varies with the location of the leak. In addition, the current also varies with the resistance of the leak. As a result, the circuit disclosed in the *Mine Power Systems* reference cannot be used to reliably detect leaks in a battery.

Thus, the need exists for a simple device for identifying a leaking battery cell, regardless of the resistance of the leak and without physical connections to each cell. Furthermore, the need exists for a device that is reliable, small, and light weight so that it can be used in harsh environments where space is at a minimum, such as in underground mining.

SUMMARY OF THE INVENTION

The present invention is directed to an apparatus and a method for determining the location and resistance of an electrical leak in a battery without measuring the individual cells that form the battery. The present invention alternately connects a resistor to the terminals of a battery to generate first signals indicative of the voltage across the resistor. A second signal is also generated. The second signal may be indicative of the voltage across the terminals of the battery or the number of cells in the battery. A controller in the present invention receives the first and second signals and determines the location of an electrical leak in the battery by solving the equation:

$$\text{location voltage} = \frac{V_b * V_{ta}}{V_{ta} + V_{tb}} \qquad (2)$$

wherein:

$V_b$ is the voltage of the battery;

$V_{ta}$ is the absolute value of the voltage across the test resistor when the first switch is closed; and $V_{tb}$ is the absolute value of the voltage across the test resistor when the second switch is closed.

The controller may also determine the location of the leak by solving the equation:

$$\text{leaking cell location} = \frac{V_{ta} * N}{V_{ta} + V_{tb}} \qquad (3)$$

wherein:

N is the number of cells in the battery;

$V_{ta}$ is the absolute value of the voltage across the test resistor when the first switch is closed; and $V_{tb}$ is the absolute value of the voltage across the test resistor when the second switch is closed.

The controller may also determine the resistance of the leak by solving the equation:

$$\text{leak resistance} = \frac{(V_b - V_{ta} - V_{tb})}{V_{ta} + V_{tb}} R_t \qquad (1)$$

wherein:

$V_b$ is the voltage of the battery;

$V_{ta}$ is the absolute value of the voltage across the test resistor when the first switch is closed;

$V_{tb}$ is the absolute value of the voltage across the test resistor when the second switch is closed; and $R_t$ is the resistance of the test resistor.

The invention solves the above-mentioned shortcomings in the prior art by determining the location and resistance of a leak in a battery, regardless of the location or resistance of the leak, and without requiring physical attachment to the individual cells of the battery. The present invention is relatively simple and reliable, making it a cost effective alternative to the prior art systems.

BRIEF DESCRIPTION OF THE DRAWINGS

For the present invention to be clearly understood and readily practiced, the present invention will be described in conjunction with the following figures, wherein.

DESCRIPTION OF THE PREFERRED EMBODIMENTS

Figure 1:
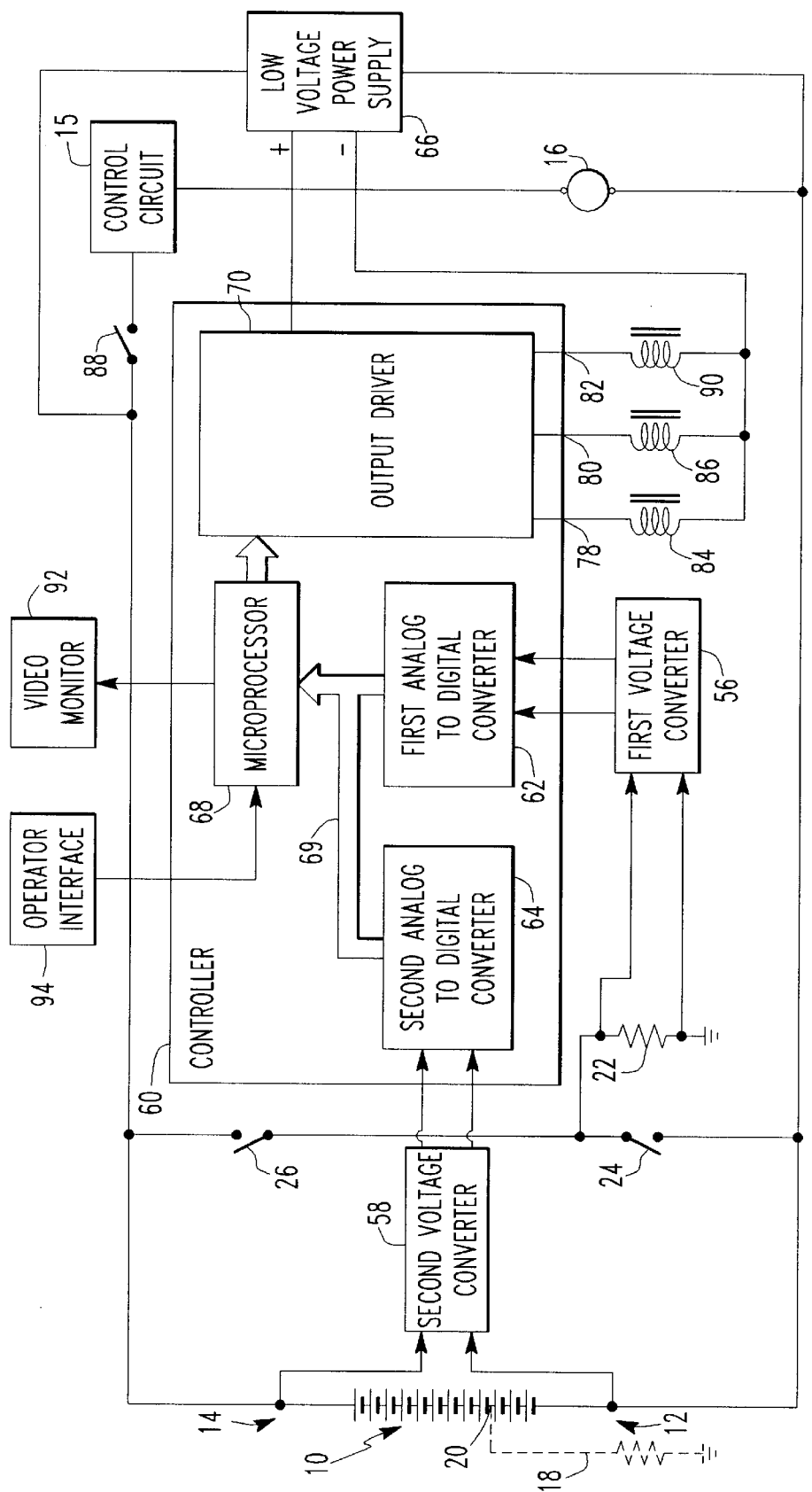
FIG. 1 is a combination circuit schematic and block diagram of a preferred embodiment of the present invention.

It is to be understood that FIG. 1 has been simplified to illustrate only those aspects of the circuit relevant for a clear understanding of the present invention, while eliminating, for the purpose of clarity, other elements. Those of ordinary skill in the art will recognize that other elements are required, such as braking systems, directional and speed controls, and power control circuits. In addition, well known devices such as voltage converters and analog-to-digital converters are not described in detail because such devices are well known in the art, and because they do not further aid in the understanding of the present invention. The present invention will be described in terms of its preferred embodiment as used in an underground mining vehicle, although other applications of the present invention are contemplated.

FIG. 1 is a combination circuit schematic and block diagram of a preferred embodiment of the present invention. The present invention is preferably used to monitor a battery 10 having a first terminal 12, a second terminal 14, and a number of cells forming the battery 10. Although the first terminal 12 is illustrated as the most negative terminal of the battery 10 and the second terminal 14 is illustrated as the most positive terminal of the battery 10, the present invention will also work if the terminals are reversed. In the preferred embodiment the battery 10 is formed from one hundred and twenty cells and produces approximately two hundred and forty volts, although batteries of any size and with any number of cells will work with the present invention. The battery 10 provides power through a control circuit 15 to drive one or more electric motors 16 used to power an underground mining vehicle. The present invention will identify a leak 18, shown in broken lines, from the battery 10 to ground. The leak 18 originates from a point 20 within the battery 10 and has an electrical resistance associated with it. The present invention will identify the location 20 and resistance of the leak 18, display that information to a user, and disconnect the battery 10 from the motor 16 if an unsafe condition is determined to exist.

Figure 2:
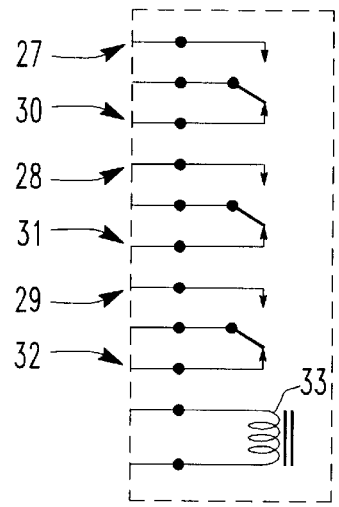
FIG. 2 is a schematic diagram of a relay used in the preferred embodiment of the present invention.

The present invention includes a test resistor 22 having a known value. Preferably the test resistor 22 has a variable resistance between approximately five hundred ohms and approximately one thousand ohm, is rated at one hundred Watts, and has one percent tolerance. Suitable resistors may be obtained from Dale Electronics, Inc., located in Columbus, Nev., as part number RH100. A first switch 24 connects the test resistor 22 to the first terminal 12 of the battery 10 and a second switch 26 connects the test resistor 22 to the second terminal 14 of the battery 10. The switches 24, 26 are preferably formed from two relays, available from Potter & Brumfield, Inc., located in Princeton, Ind., as part number KUP-14D15-12. FIG. 2 illustrates details of one of the relays forming the switches 24, 26, wherein the relay is a three pole, double throw relay, having three normally open contacts 27, 28, 29, three normally closed contacts 30, 31, 32, and a relay coil 33.

Figure 3:
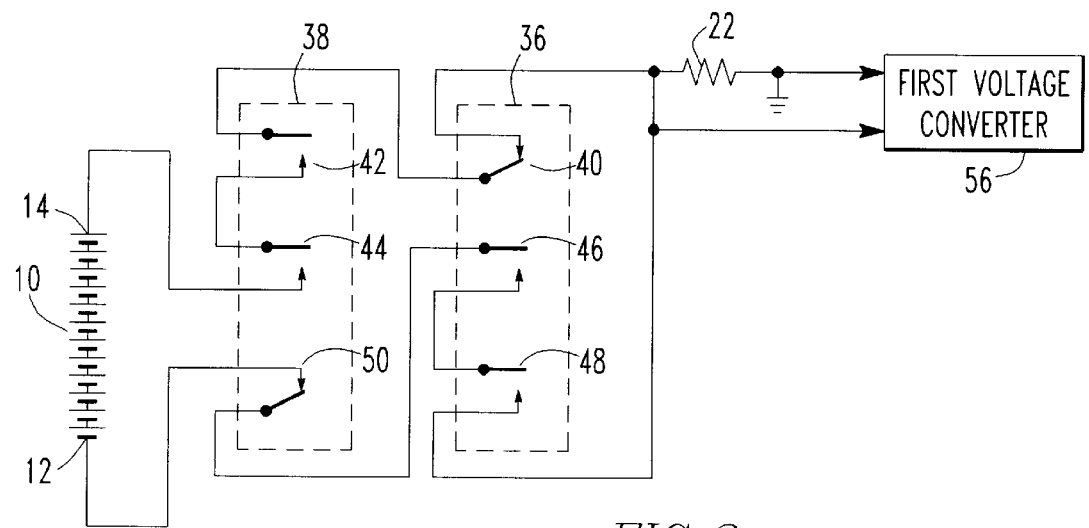
FIG. 3 is a circuit schematic illustrating a preferred embodiment of the switches illustrated in FIG. 1.
Figure 4:
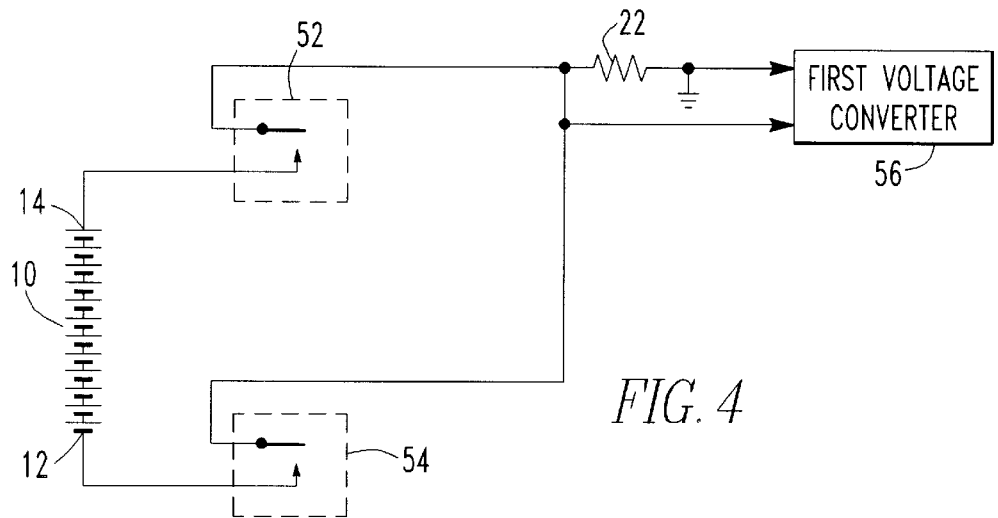
FIG. 4 is a circuit schematic illustrating an alternative embodiment of the switches illustrated in FIG. 1.

FIG. 3 illustrates the preferred configuration of first and second relays 36, 38 collectively forming the first and second switches 24, 26 (shown in FIG. 1). In the preferred embodiment, the first switch 24 is composed of two normally open contacts 46 and 48 from the first relay 36, and one normally closed contact 50 from the second relay 38. The second switch 26 is composed of one normally closed contact 40 from the first relay 36, and two normally open contacts 42, 44 from the second relay 38. That configuration ensures that the first and second switches 24, 26 can never both be closed at the same time, thereby ensuring that the first and second terminals 12, 14 of the battery 10 will not be shorted together through the first and second switches 24, 26. As illustrated in FIG. 4, other switch configurations may also be used, such as a pair of normally open, single pole, single throw relays 52, 54. The embodiment illustrated in FIG. 4 will not offer the short circuit protection of the preferred embodiment, but will offer a simpler design.

Referring back to FIG. 1, when either the first or second switch 24, 26 is closed and a leak 18 exists, a voltage will appear across the test resistor 22. When the first switch 24 is closed the first terminal 12 of the battery 10 is connected to ground through the test resistor 22. If a leak 18 exists in the battery 10, a negative voltage appears across the test resistor 22. Likewise, when the second switch 26 is closed the second terminal 14 is connected to ground through the test resistor 22. If a leak 18 exists in the battery 10, a positive voltage appears across the test resistor 22. The magnitude of the voltage across the test resistor 22 depends on the resistance and location of the leak 18. For example, if the leak 18 is near the first terminal 12 and the first switch 24 is closed, the voltage across the test resistor 22 will be small. For the same leak when the second switch 26 is closed, a large voltage will appear across the test resistor 22. Furthermore, the voltage appearing across the test resistor 22 will have an inverse relationship to the resistance of the leak 18, because when the leak 18 has a large resistance less current will flow through the leak 18 and the corresponding voltage across the test resistor 22 will be lower. In contrast, a low resistance leak 18 will result in more current and a larger voltage across the test resistor 22.

In the preferred embodiment, the voltage across the test resistor 22 can be between positive and negative two hundred and forty volts. As a result, a first voltage converter 56 is preferably used to generate an output voltage proportional to the voltage appearing across the test resistor 22 but at a level more suitable for use with solid state devices. The first voltage converter 56 monitors the voltage across the test resistor 22, accepts inputs between positive and negative three hundred volts, and produces an output signal between positive and negative twelve volts, with an accuracy of approximately +/− one percent. In the preferred embodiment, the first voltage converter 56 receives power from a twelve volt power supply used for the underground mining vehicle's headlights. In addition, the first voltage converter 56 contains its own power supply generating positive and negative twelve volts for producing its output signal. The preferred first voltage converter 56 may be obtained from Joy Technologies, Inc., located in Franklin, Pa., as part number 00603026-0003. Voltage converters may also be obtained from Dmarc, Inc., located in Mentor, Ohio.

A second voltage converter 58 monitors the voltage across the terminals 12, 14 of the battery 10, and preferably operates in the same manner as the first voltage converted 56.

A controller 60 receives the output of the first and second voltage converters 56, 58 and determines whether a leak 18 exists, determines the resistance of the leak 18, and determines whether to disconnect the battery 10 from the electric motor 16 until the leak 18 is fixed. The controller 60 also opens and closes of the first and second switches 24 and 26.

In the preferred embodiment the first and second voltage converters 56, 58 produce analog output signals, so the controller 60 includes first and second analog-to-digital converters 62, 64 for receiving the analog signals from the voltage converters 62, 64 and for producing digital output signals. The analog-to-digital converters 62, 64 can receive input signals between positive and negative twelve volts, and each produce an eight bit output signal with an accuracy of approximately 0.5 percent.

The controller 60 receives power from a low voltage power supply 66. The power supply 66 receives high voltage power from the battery 10 and produces regulated low voltage power, approximately twelve volts in the preferred embodiment, for use by the controller 60.

Figure 5:
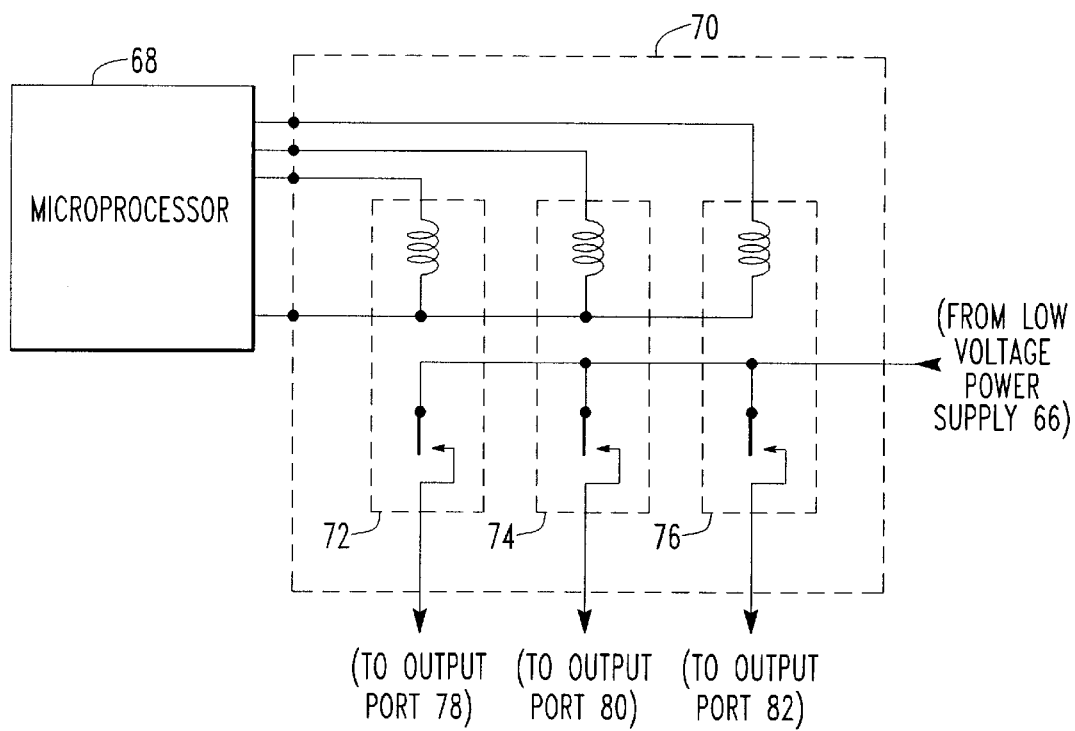
FIG. 5 is a block diagram illustrating the output driver of FIG. 1.

The controller 60 also includes a microprocessor 68. A suitable microprocessor 68 may be obtained from Matric Ltd., located in Oil City, Pa., The microprocessor 68 used in the preferred embodiment may be obtained from Joy Technologies, Inc., located in Franklin, Pa., as part number 00572110-0015. The microprocessor 68 receives data from both of the analog-to-digital converters 62, 64 over a common data bus 69 shared by all three devices 62, 64, 68. Other devices may also share the data bus 69. The microprocessor 68 controls the opening and closing of the first and second switches 24 and 26 through an output driver 70. As illustrated in FIG. 5, the output driver 70 is preferably a series of relays 72, 74, 76 responsive to output signals from the microprocessor 68 for driving output ports 78, 80, 82 of the controller 60, with power supplied to the output ports 78, 80, 82 by the low voltage power supply 66. Referring back to FIG. 1, two of the output ports 78, 80 are connected to the relay coils 84, 86 for the first and second relays 36 and 38 (shown in FIG. 3), respectively, thereby controlling the opening and closing of the first and second switches 24, 26. In an alternative embodiment, the output driver 70 may be a conventional solid state device which receives control signals from the microprocessor 68 and amplifies them to drive the output ports 78, 80, 82 of the controller 60.

The microprocessor 68 may also control a fault relay 88 via the fault relay's coil 90 at the output port 82. The fault relay 88 preferably connects the second terminal 14 of the battery 10 with the control circuit 15 and the electric motor 16. Under normal conditions, the fault relay 88 is closed, making power available to the control circuit 15 and the motor 16. However, when the microprocessor 68 determines that an unsafe condition exists, the fault relay 88 is opened, thereby disconnecting the battery 10 from the control circuit 15 and motor 16 until the unsafe condition is corrected.

The microprocessor 68 also controls a video monitor 92, preferably a flat panel, liquid crystal display, on which information regarding the battery 10 is displayed for the user. For example, the monitor 92 may display the location and resistance of any leaks 18, an estimated range of travel remaining on the battery 10, and other information desired by the user. The monitor 92 is used in conjunction with an operator interface 94, such as a joy stick, to allow the user to select various options and obtain additional information regarding the information displayed on the monitor 92. In the preferred embodiment, the microprocessor 68 performs many functions in addition to detecting leaks 18, such as controlling power to the electric motor 16 and controlling regenerative and friction braking systems (not shown).

Many variations of the preferred embodiment are possible. For example, although the first and second voltage converters 56, 58 are used in the preferred embodiment, they are not required to realize the benefits of the present invention. In low voltage applications, the voltage of the battery 10 and the test resistor 22 may be provided directly to the controller 60. The first and second analog-to-digital converters 62, 64 are also not required to realize the benefits of the present invention. The first and second analog-to-digital converters 62, 64 may be eliminated, for example, if voltage converters 56, 58 producing digital output signals are used. In an alternative embodiment, the first and second analog-to-digital converters 62, 64 are eliminated and the microprocessor 68 includes integral analog-to-digital converters for receiving the analog output signals from the first and second voltage converters 56, 58.

Figure 6:
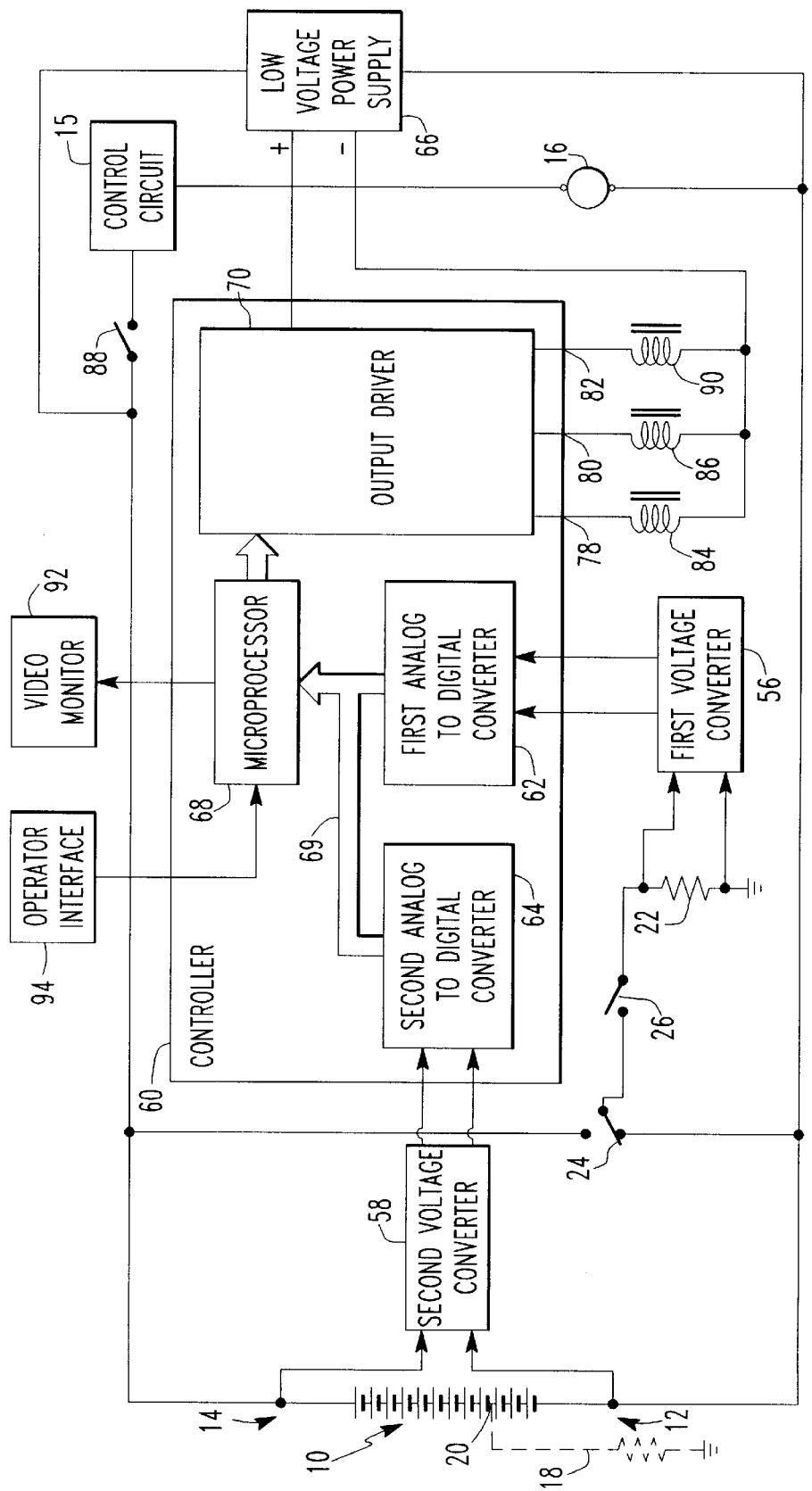
FIG. 6 is a combination circuit schematic and block diagram illustrating an alternative embodiment of the present invention.

FIG. 6 illustrates an alternative switch configuration for the present invention. The first and second switches 24, 26 of FIG. 1 are rearranged so that the first switch 24 selects between the first and second terminals 12, 14 of the battery 10, and the second switch 26 connects the first switch 24 to the test resistor 22. Other configurations are also possible.

In operation, and with reference to both FIGS. 1 and 6, the voltage of the battery 10 decreases significantly when the battery 10 is driving the electric motor 16, and can increase significantly under regenerative braking. As a result, the microprocessor 68 preferably only obtains data when the vehicle is stopped. The microprocessor 68 controls the first and second switches 24, 26 via the output ports 78, 80 of the controller 60 in order to obtain data regarding the battery 10. Preferably, data is obtained every four seconds while the vehicle is stopped. The voltage across the test resistor 22 is monitored by the first voltage converter 56 and a corresponding signal is produced, digitized by the first analog-to-digital converter 62, and provided to the microprocessor 68. At approximately the same time, the microprocessor 68 obtains data regarding the voltage of the battery 10 via the second voltage converter 58 and the second analog-to-digital converter 64.

The microprocessor 68 determines the resistance of the leak 18 and the location 20 of the leak 18 by solving the following equations:

$$\text{leak resistance} = \frac{(V_b - V_{ta} - V_{tb})}{V_{ta} + V_{tb}} R_t \quad (1)$$

$$\text{location voltage} = \frac{V_b * V_{ta}}{V_{ta} + V_{tb}} \quad (2)$$

wherein:

$V_b$ is the voltage of the battery;

$V_{ta}$ is the absolute value of the voltage across the test resistor when the first switch is closed;

$V_{tb}$ is the absolute value of the voltage across the test resistor when the second switch is closed; and $R_t$ is the resistance of the test resistor.

The location voltage determines the position in the battery 10, measured in terms of voltage from the negative terminal 12, where the leak 18 exists. For example, a battery formed from ten cells each generating two volts will result in a battery generating twenty volts. If the location voltage of a leak is calculated as five volts, then the leaking cell is the third cell from the common terminal 12 of the battery 10, since the third cell has a common terminal 12 at four volts and a positive terminal at six volts in the battery. The first cell accounts for zero through two volts of the battery, and the second cell accounts for two through four volts of the battery. The present invention may calculate the particular cell that is leaking by solving the following equation:

$$\text{leaking cell location} = \frac{V_{ta} * N}{V_{ta} + V_{tb}} \quad (3)$$

wherein N is the number of cells in the battery. The value N is preferably stored in an internal memory in the microprocessor 68, although it may be stored in a memory external to the microprocessor 68.

The present invention will identify leaks if they exist anywhere in the electrical system. For example, if the location voltage equation (2) is used and there is a leak to ground in the motor, the circuit will indicate a location voltage of either the total voltage of the battery 10 or zero volts, depending on the location of the leak. A location voltage equal to the total voltage of the battery 10 will be indicated if the leak is on the positive side of the battery 10, and a location voltage of zero volts will be indicated if the leak is on the negative side 12 of the battery 10. Analogous results will be obtained if the leaking cell location equation (3) is used.

Therefore, once the microprocessor 68 determines the location of a leak, it can indicate on the video monitor 92 which cell is leaking. In the preferred embodiment, if the resistance of the leak 18 is less than a predetermined value, preferably between approximately five hundred ohms and approximately one thousand ohms, the microprocessor 68 will determine that an unsafe condition exists and will open the fault relay 88 until the unsafe condition is corrected. There is also an override option wherein the user may force the fault relay 88 closed in the event of an emergency when the vehicle, even with an unsafe condition, must be moved.

Figure 7:
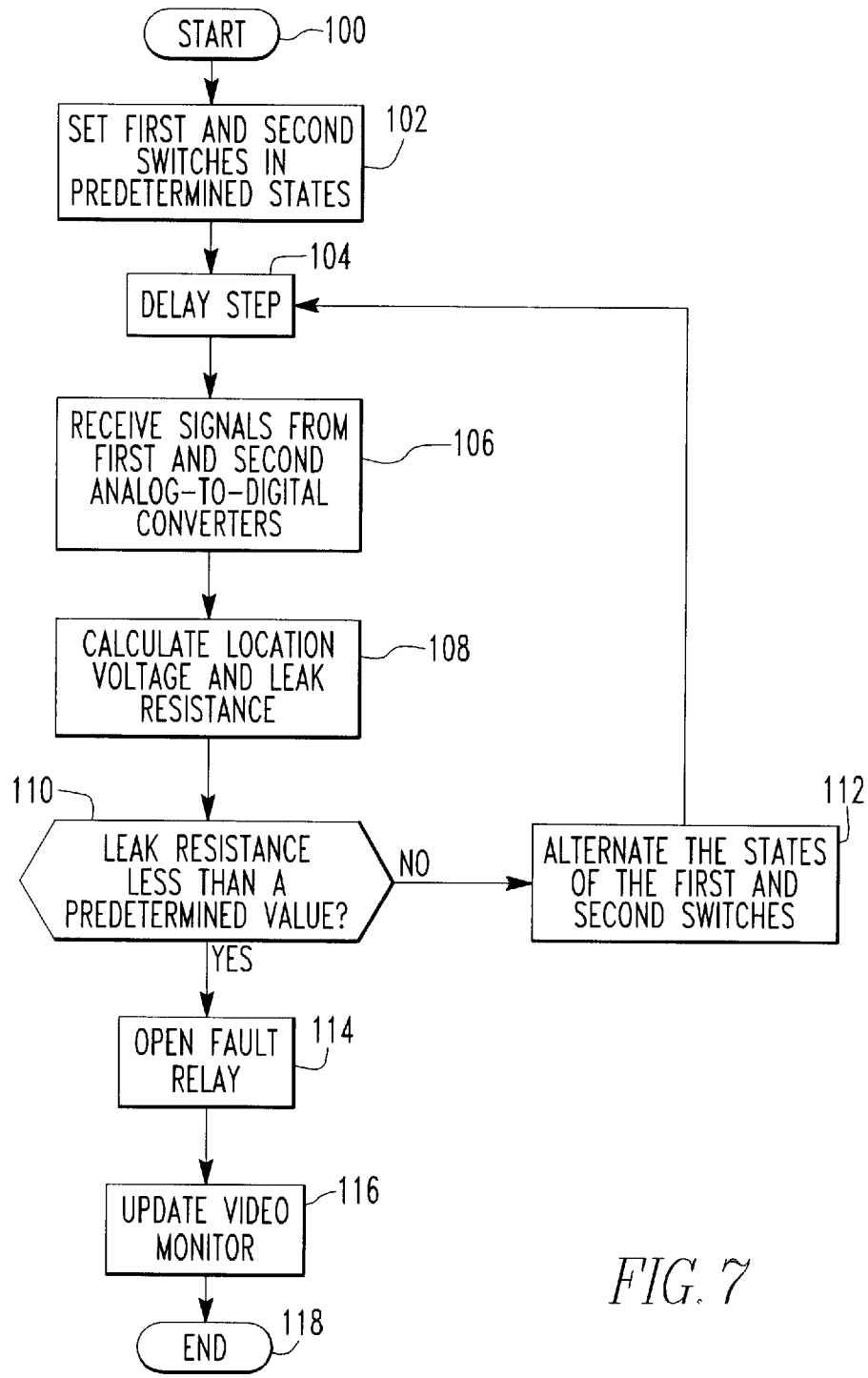
FIG. 7 is a flow chart illustrating the operation of the present invention.

FIG. 7 is a flow chart illustrating the operation of the microprocessor 68 for checking the status of the battery 10. In step 100 the microprocessor 68 begins the process of checking the status of the battery 10. In step 102, the microprocessor 68 sets the first and second switches 24, 26 to predetermined states. Step 104 is a delay wherein the process waits a predetermined period of time, preferably approximately four seconds. The process is delayed because, in the preferred embodiment, there is no need to check the battery 10 more often than approximately every four seconds. Depending on the particular application of the invention, however, the delay may be lengthened or shortened. At least a small delay is preferable to allow the signals to stabilize before proceeding. In step 106 the microprocessor 68 receives the signals from the first and second analog-to-digital converters 62, 64. In step 108, the microprocessor 68 calculates the location voltage and the leak resistance from the signals received from the first and second analog-to-digital converters 62, 64. Alternatively, the microprocessor 68 may calculate the leaking cell location instead of the location voltage. In step 110 the microprocessor 68 determines whether the leak resistance is less than a predetermined value, preferably between approximately five hundred ohms and approximately one thousand ohms. If the leak resistance is not less than the predetermined value, then the process proceeds to step 112 and alternates the states of the first and second switches 24, 26. For example, if the first switch 24 is closed and the second switch 26 is open, then the effect of step 112 is to open the first switch 24 and close the second switch 26. Thereafter, the process returns to the delay step 104. Returning to step 110, if the leak resistance is less than the predetermined value, indicating a serious leak, the process proceeds to step 114 and opens the fault relay 88. After the fault relay 88 is opened, the video monitor 92 is updated in step 116 to indicate that a serious leak has been detected and the process ends at step 118.

Even after a serious leak is detected, the process may be restarted. Often a leak is caused by external conditions forming a leakage path from the battery 10 to ground, and in those cases cleaning the terminals of the battery 10 will often fix the leak and make the system safe for use. Accordingly, a reset may be provided, such as through the operator interface 94 (shown in FIG. 1), for closing the fault relay 88 and restarting the leak detection process if it is believed that the leak has been corrected.

Referring back to FIG. 1, some applications of the present invention do not require immediate action in response to a detected leak 18 because in some applications a hazardous condition is very slow to develop and can be corrected at a later time. In an alternative embodiment, the microprocessor 68 monitors the battery 10, displays leak information, records the data, but does not control the fault relay 88. In that embodiment, the process eliminates steps 110, 114, and 118, and always proceeds from step 108 to step 112. The data stored by the microprocessor 68 is examined by maintenance personnel on a periodic basis to determine whether corrective measures are needed.

In the preferred embodiment, the system is calibrated before it is placed in actual use so that inaccuracies in the components can be accounted for. The preferred calibration routine grounds the battery 10 at approximately four cells from the first terminal 12 and the microprocessor 68 calculates a leaking cell location. Another ground is made at approximately four cells from the second terminal 14, and another leaking cell location is calculated. If the calculated leaking cell locations are different from the actual locations, the leaking cell equation (3) may be modified with "offset" and "spread" values, as shown in the following equation:

$$\text{leaking cell location} = \frac{V_{ta} * (N + S)}{V_{ta} + V_{tb}} + \beta \quad (4)$$

wherein:
S=the "spread";
N=the number of cells in the battery; and
β=the "offset".

The spread value "S" changes the proportions of the leaking cell location value. If the spread value is zero, the leaking cell location is not affected. If the spread value is greater than zero, the leaking cell location is increased with the spread value. Likewise, if the spread value is less than zero, the leaking cell location is decreased with the spread value. Another way of looking at the spread value is that it affects the "spread", or range of values, of the leaking cell location. The spread value can increase the spread of the leaking cell location by being greater than zero, or decrease the spread of the location voltage by being less than zero.

The offset value "β" also affects the leaking cell location, but does so in a different way than the spread value. The offset value adds a constant to the leaking cell location, and the constant can be either a positive value or a negative value. If the spread value is thought of as changing the spread of values of the leaking cell location, then the offset value can be thought of as moving the spread of values, but not changing the magnitude of the spread. Collectively, the spread and offset values are used to calibrate the leaking cell location equation so that it accurately indicates the location of leaking cells within the battery.

The offset and spread values are typically constants once the calibration is completed, although it is possible for those values to be variables that change, for example, as a function of the voltage across the battery 10. In the preferred embodiment of the present invention, the leaking cell location equation (4) is programmed into the microprocessor 68 with the offset and spread values being zero, so as to not affect the leaking cell location equation. If the calibration step indicates that a modification is desired, the values of the offset and spread are changed in the programming of the microprocessor 68. The calibration step is initially performed before the system enters actual use, and may be subsequently performed to account for changes to components over time, or when a new battery 10 is installed to account for variations between batteries.

The number of cells "N" in the battery is typically a constant, although it is possible for the number of cells to change. For example, when an old battery is replaced with a new one it is possible that the new battery will have a different number of cells than the old battery. In such a case, the number of cells "N" in the leaking cell location equations (3) and (4) should be corrected.

Likewise, the location voltage may also be modified with spread and offset values, as shown in the following equation:

$$\text{location voltage} = \frac{V_{ta} * (V_b + S)}{V_{ta} + V_{tb}} + \beta \quad (5)$$

wherein:

S=the "spread";

β=the "offset".

The spread and the offset value are both in units of volts, and the effects of the spread and offset values are analogous to those discussed hereinabove with respect to equation (4).

Those with ordinary skill in the art will recognize that many modifications and variations of the present invention may be implemented. The foregoing description and the following claims are intended to cover all such modifications and variations.

What is claimed is:

1. An apparatus for determining a location of an electrical leak in a battery having first and second terminals, comprising:

a resistor;

a switch assembly for selectively connecting said resistor to the first terminal of the battery and for selectively connecting said resistor to the second terminal of the battery; and a controller responsive to a first signal indicative of a voltage across said resistor, responsive to a second signal indicative of a feature of the battery, and for calculating a quotient formed from first and second values and indicative of the location of the leak, the first value including a product of the first signal when said resistor is connected to the first terminal of the battery and the second signal, and the second value including a sum of the first signal when said resistor is connected to the first terminal of the battery and the first signal when said resistor is connected to the second terminal of the battery.

2. The apparatus of claim 1, wherein said controller is responsive to the second signal, and the second signal is indicative of a voltage across the first and second terminals of the battery.

3. The apparatus of claim 1, wherein said controller is responsive to the second signal, and the second signal is indicative of a number of cells in the battery.

4. The apparatus of claim 2, additionally comprising:

a first voltage converter responsive to the voltage across said resistor for generating the first signal; and a second voltage converter responsive to the voltage across the battery for generating the second signal.

5. The apparatus of claim 4, wherein:

said first voltage converter generates the first signal having an amplitude less than the voltage across said resistor; and said second voltage converter generates the second signal having an amplitude less than the voltage across the first and second terminals of the battery.

6. The apparatus of claim 1, additionally comprising a memory for storing an offset value, wherein said controller is responsive to a sum formed from the offset value and the quotient of the first and second values, for determining the location of the leak.

7. The apparatus of claim 1, additionally comprising a memory for storing a spread value, wherein said controller is responsive to the quotient of the first and second values, and the first value includes the first signal multiplied by the sum of the second signal and a spread value.

8. The apparatus of claim 1, wherein:

said resistor has a first end and said resistor has a second end connected to ground;

said switch assembly includes a first switch for selectively connecting the first end of said resistor to the first terminal of the battery; and said switch assembly includes a second switch for selectively connecting the first end of said resistor to the second terminal of the battery.

9. The apparatus of claim 1, wherein:

said resistor has a first end and said resistor has a second end connected to ground;

said switch assembly includes a first switch having a first terminal, said first switch for selectively connecting said first terminal of said first switch to one of the first and second terminals of the battery; and said switch assembly includes a second switch for selectively connecting the first end of said resistor to said first terminal of said first switch.

10. The apparatus of claim 1, wherein:

said controller includes a first analog-to-digital converter responsive to the first signal for generating a first digital signal indicative of the first signal; and said controller includes a second analog-to-digital converter responsive to the second signal for generating a second digital signal indicative of the second signal.

11. The apparatus of claim 10, wherein said controller includes a microprocessor responsive to the first and second digital signals for determining the location of the leak.

12. The apparatus of claim 1, wherein said controller includes an output driver for producing first and second output signals for controlling said switch assembly.

13. An apparatus for determining electrical resistance of an electrical leak in a battery having first and second terminals, comprising:

a resistor having a first resistance;

a switch assembly for selectively connecting said resistor to the first terminal of the battery and for selectively connecting said resistor to the second terminal of the battery; and a controller responsive to a first signal indicative of a voltage across said resistor and responsive to a second signal indicative of a voltage across the first and second terminals of the battery, for calculating a product formed from the first resistance and a quotient of first and second values for determining the resistance of the leak, the first value including the second signal minus the first signal when said resistor is connected to the first terminal of the battery, minus the first signal when said resistor is connected to the second terminal of the battery, and the second value including a sum of the first signal when said resistor is connected to the first terminal of the battery and the first signal when said resistor is connected to the second terminal of the battery.

14. The apparatus of claim 13 for use with an electric motor, additionally comprising a fault switch responsive to said controller and in series with one of the terminals of the battery and in series with the electric motor, for selectively disconnecting the electric motor from one of the terminals of the battery when a fault having a resistance less than a predetermined value is detected.

15. The apparatus of claim 14, wherein the predetermined value is adjustable.

16. The apparatus of claim 15, wherein the predetermined value is between approximately five hundred ohms and approximately one thousand ohms.

17. The apparatus of claim 14, wherein said controller includes an output driver for producing first and second output signals for controlling said switch assembly and for producing a third output signal for controlling said fault switch.

18. The apparatus of claim 13, additionally comprising an operator interface for providing instructions from an operator to said controller.

19. A method of determining a location of an electrical leak within a battery having first and second terminals, comprising the steps of:

connecting a resistor to the first terminal of the battery;

producing a first signal indicative of a voltage across the resistor;

connecting the resistor to the second terminal of the battery;

producing a second signal indicative of the voltage across the resistor;

producing a third signal indicative of a feature of the battery;

determining a first value including a product of the first signal and the third signal;

determining a second value including a sum of the first and second signals; and determining the location of the leak from a quotient formed from the first and second values.

20. The method of claim 19, wherein the step of producing the third signal includes producing the third signal indicative of the voltage across the first and second terminals of the battery.

21. The method of claim 19, wherein the step of producing the third signal includes the step of producing the third signal indicative of a number of cells in the battery.

22. The method of claim 19, wherein the step of determining the location of the leak includes determining a sum formed from an offset value and the quotient of the first and second values.

23. The method of claim 19, wherein the step of determining the location of the leak includes the step of determining the quotient of the first and second values when the first value includes the first signal multiplied by the sum of the third signal and a spread value.

24. A method for determining the resistance an electrical leak within a battery having first and second terminals, comprising the steps of:

connecting a resistor having a first resistance to the first terminal of the battery;

producing a first signal indicative of a voltage across the resistor;

connecting the resistor to the second terminal of the battery;

producing a second signal indicative of the voltage across the resistor;

producing a third signal indicative of the voltage across the first and second terminals of the battery;

determining a first value including the third signal minus the first signal, minus the second signal;

determining a second value including the sum of the first and second signals; and determining the resistance of the leak from a product formed from the first resistance and a quotient of the first and second values.

25. The method of claim 24 for use with an electric motor, additionally comprising the step of disconnecting power from the electric motor when the resistance of a leak is below a predetermined value.

26. The method of claim 25, wherein said predetermined value is adjustable.

27. The method of claim 26, wherein said predetermined value is between approximately five hundred ohms and approximately one thousand ohms.

* * * * *